(12) United States Patent
Kobrinsky et al.

(10) Patent No.: US 8,993,404 B2
(45) Date of Patent: Mar. 31, 2015

(54) METAL-INSULATOR-METAL CAPACITOR FORMATION TECHNIQUES

(71) Applicant: Intel Corporation, Santa Clara, CA (US)

(72) Inventors: Mauro J. Kobrinsky, Portland, OR (US); Robert L. Bristol, Portland, OR (US); Michael C. Mayberry, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/748,277

(22) Filed: Jan. 23, 2013

(65) Prior Publication Data

US 2014/0203400 A1    Jul. 24, 2014

(51) Int. Cl.
   *H01L 21/20*     (2006.01)
   *H01L 21/033*    (2006.01)
   *H01L 49/02*     (2006.01)

(52) U.S. Cl.
   CPC ............ *H01L 21/0337* (2013.01); *H01L 28/82* (2013.01)
   USPC ........................................................ 438/396

(58) Field of Classification Search
   CPC ............... B81C 2201/0149; B81C 2201/0147; B81C 2201/0101; B81C 2201/0198; H01L 27/224
   USPC ........................................................ 257/532
   See application file for complete search history.

(56) References Cited

U.S. PATENT DOCUMENTS 8,003,425 B2 *  8/2011  Adkisson et al. ............... 438/65
2004/0102014 A1  5/2004  Ning et al.

(Continued)

FOREIGN PATENT DOCUMENTS

JP      2007-59761       *  3/2007
KR  10-2007-0118876 A    12/2007
WO     2014/116496 A1     7/2014

OTHER PUBLICATIONS

Takeda et al., Mar. 8, 2007.*

(Continued)

*Primary Examiner* — Ahmed Sefer
(74) *Attorney, Agent, or Firm* — Finch & Maloney PLLC

(57) ABSTRACT

Techniques and structure are disclosed for providing a MIM capacitor having a generally corrugated profile. The corrugated topography is provisioned using sacrificial, self-organizing materials that effectively create a pattern in response to treatment (heat or other suitable stimulus), which is transferred to a dielectric material in which the MIM capacitor is formed. The self-organizing material may be, for example, a layer of directed self-assembly material that segregates into two alternating phases in response to heat or other stimulus, wherein one of the phases then can be selectively etched with respect to the other phase to provide the desired pattern. In another example case, the self-organizing material is a layer of material that coalesces into isolated islands when heated. As will be appreciated in light of this disclosure, the disclosed techniques can be used, for example, to increase capacitance per unit area, which can be scaled by etching deeper capacitor trenches/holes.

23 Claims, 9 Drawing Sheets

(56) References Cited

U.S. PATENT DOCUMENTS

| | | | |
|---|---|---|---|
| 2005/0255581 A1* | 11/2005 | Kim et al. | 435/287.2 |
| 2007/0166911 A1 | 7/2007 | Lo et al. | |
| 2007/0281220 A1 | 12/2007 | Sandhu et al. | |
| 2010/0163180 A1* | 7/2010 | Millward | 156/345.3 |
| 2010/0224960 A1 | 9/2010 | Fischer | |
| 2011/0272381 A1* | 11/2011 | Millward et al. | 216/37 |
| 2011/0272810 A1 | 11/2011 | Clevenger et al. | |

OTHER PUBLICATIONS

Black et al., "Integration of self-assembled diblock copolymers for semiconductor capacitor fabrication", Applied Physics Letters, vol. 79, Issue No. 3, Jul. 16, 2001, 4 pages.

Curry et al., "Development of "Reverse Phase" PMMA-b-PS block copolymers as Self-Assembled Hard-Masks for Reactive Ion Etching", University of West Alabama, Center for Materials for Information Technology, Department of Chemistry, Department of Metallurgical and Materials Engineering, University of Alabama, 2008, 1 page.

Courtland, "Self-Assembly Takes Shape", IEEE Spectrum, Semiconductors / Nanotechnology, Feb. 2012, 3 pages.

Liu et al., "Integration of block copolymer directed self assembly with 193i lithography toward fabrication of nanowire MOSFETs," SPIE Advanced Lithography, San Jose, CA, Feb. 27-Mar. 3, 2011, 25 pages.

International Search Report and Written Opinion received for PCT Patent Application No. PCT/US2014/011856, mailed on May 20, 2014, 13 pages.

* cited by examiner

Figure 7″
Figure 7‴
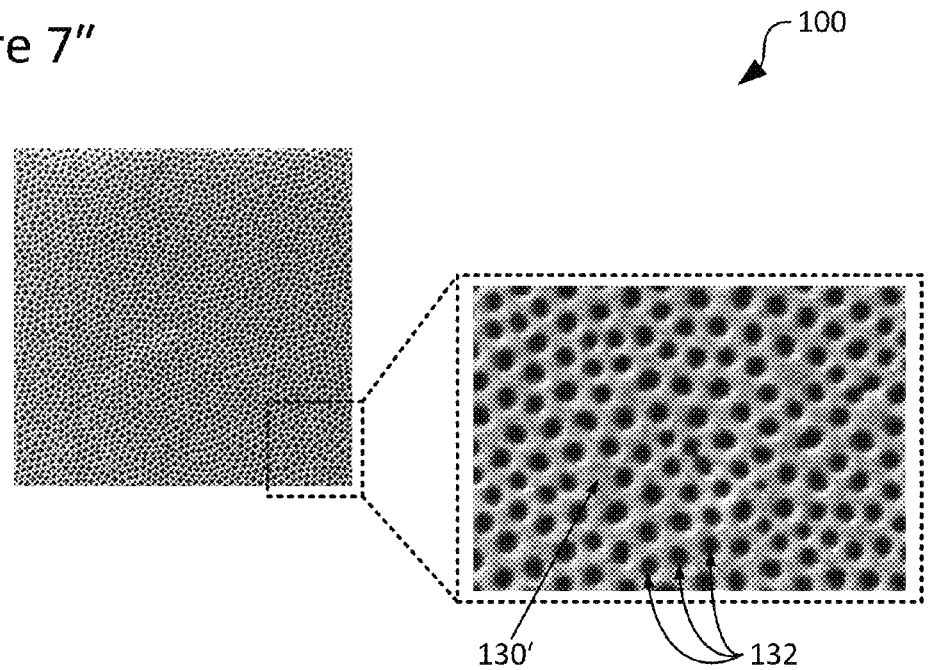

METAL-INSULATOR-METAL CAPACITOR FORMATION TECHNIQUES

BACKGROUND

Integrated circuit (IC) design in the deep-submicron process nodes (e.g., 32 nm and beyond) involves a number of non-trivial challenges, and ICs featuring capacitive structures have faced particular complications, such as those with respect to providing sufficient power delivery for integrated devices. Continued advances in technology generations will tend to exacerbate such problems.

BRIEF DESCRIPTION OF THE DRAWINGS

FIG. 5' is a tilted perspective scanning electron microscope (SEM) image of an example IC after selective etching of a DSA layer, in accordance with an embodiment of the present invention.

FIG. 7' illustrates the IC of FIG. 7 after further patterning thereof, in accordance with another embodiment of the present invention.

FIGS. 7" and 7'" are top-down perspective and tilted perspective SEM images, respectively, of an example IC after further etching thereof to reveal the patterned passivation layer, in accordance with an embodiment of the present invention.

Figure 1:
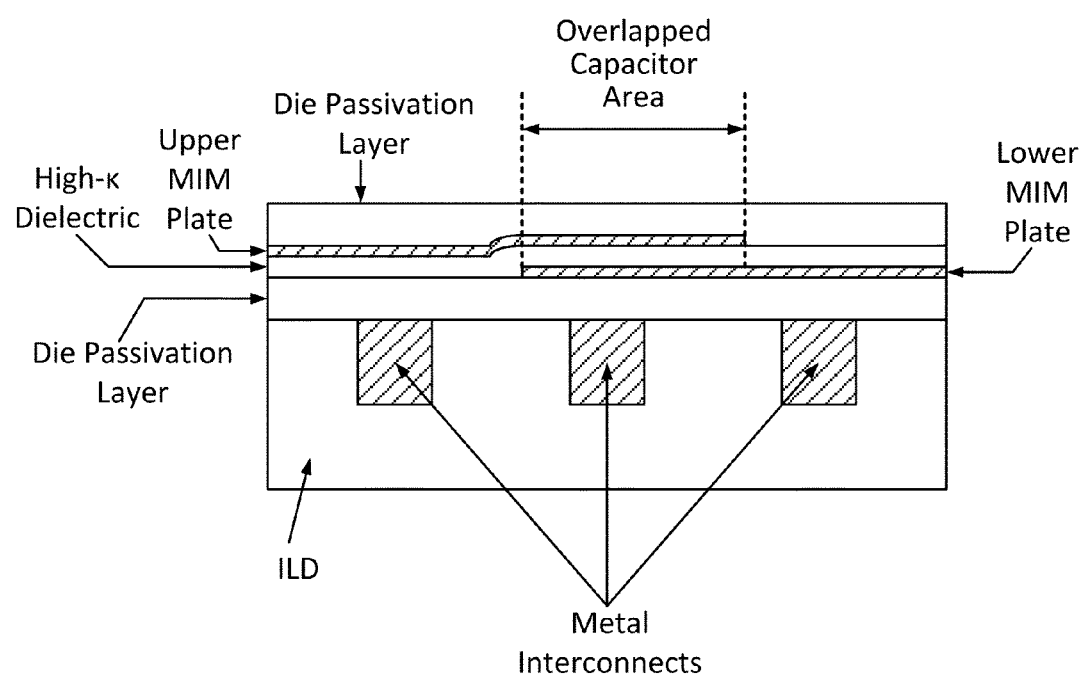
FIG. 1 is a side cross-sectional view of an example integrated circuit including a planar plate-based MIM capacitor.

For purposes of clarity, not every component may be labeled in every drawing. Furthermore, as will be appreciated in light of this disclosure, the figures are not necessarily drawn to scale or intended to limit the claimed invention to the specific configurations shown. For instance, while some figures generally indicate straight lines, right angles, and smooth surfaces, an actual implementation of the disclosed techniques may produce less than perfect straight lines, right angles, and some features may have surface topography or otherwise be non-smooth, given real world limitations of processing equipment and materials. In short, the figures are provided merely to show example structures.

DETAILED DESCRIPTION

Techniques and structure are disclosed for providing a metal-insulator-metal (MIM) capacitor having a generally corrugated profile. The corrugated topography is provisioned using self-organizing materials that effectively create a pattern in response to treatment (e.g., heat or other suitable stimulus), which is transferred to a dielectric material in which the MIM capacitor is formed. The self-organizing material may be, for example, a sacrificial layer of directed self-assembly (DSA) material that segregates into two alternating phases in response to heat, solvent, or other stimulus, wherein one of the phases then can be selectively etched with respect to the other phase so as to provide the desired pattern. In another example case, the self-organizing material is a sacrificial layer of material that coalesces into isolated islands when sufficiently heated. As will be appreciated in light of this disclosure, the disclosed techniques can be used, for example, to increase capacitance per unit area, which can be scaled by etching deeper capacitor trench/holes. Numerous configurations and variations will be apparent in light of this disclosure.

General Overview

As previously indicated, there are a number of non-trivial issues which can arise that can complicate power delivery for integrated circuit (IC) devices. In an attempt to address some of these concerns, plate-based metal-insulator-metal (MIM) capacitors may be added to the interconnect stack in an uppermost passivation layer of a given IC. For example, consider FIG. 1, which is a side cross-sectional view of an example IC including a planar plate-based MIM capacitor. As can be seen, the plate-based MIM capacitor of FIG. 1 includes a lower electrode plate and an upper electrode plate with a layer of dielectric material disposed there between. The overlapping area of the two electrode plates is denoted by the dotted lines in the figure.

However, with each new technology generation, there is generally a need to increase the total on-die capacitance per unit area, for instance, for purposes of providing adequate power delivery to integrated devices. This may be particularly true, for example, in the case of integrated voltage regulators. Attempting to address the aforementioned increasing demand for higher capacitance per unit area by merely increasing the number of pairs of capacitor plates (e.g., from two to three, three to five, and so on) of the plate-based MIM capacitor shown in FIG. 1 will undesirably increase manufacturing cost and IC bulk.

Thus, and in accordance with an embodiment of the present invention, techniques are disclosed for providing a MIM capacitor having a generally corrugated profile. In some embodiments, a MIM capacitor provided as described herein may be configured, for example, as a tri-layer structure—two electrode layers having a high-κ dielectric layer disposed there between. In some embodiments, such a MIM capacitor may be deposited or otherwise formed, for example, over or within an integrated circuit (IC). In some embodiments, a MIM capacitor configured as described herein may be provided with a generally corrugated profile, for example, by virtue of its being deposited or otherwise formed over an underlying IC layer (e.g., a passivation layer) having a corrugated surface. Provision of such a corrugated passivation layer may be done, in some embodiments, using a two-dimensional directed self-assembly (DSA) array. The DSA may be patterned, and such pattern subsequently may be transferred to an underlying passivation layer, in accordance with an embodiment. Thereafter, a MIM capacitor may be formed over the resultant surface topography of the patterned passivation layer.

In some other embodiments, provision of a corrugated passivation layer may be done using a sacrificial layer/film that agglomerates or otherwise coalesces into islands in response to heat treatment. The resulting pattern subsequently may be transferred to an underlying passivation layer, in accordance with such an embodiment. Thereafter, a MIM capacitor may be formed over the resultant surface topography provided by the patterned passivation layer. In some still other embodiments, lithographic techniques may be used to provide a patterned resist layer which may be utilized in providing a corrugated passivation layer topography over which a MIM capacitor may be formed. In short, numerous configurations and variations will be apparent in light of this disclosure.

In some cases, the disclosed techniques may be used, for example, to provide a corrugated MIM capacitor which, in accordance with some embodiments, improves the total on-die capacitance per unit area for a given IC. For instance, a corrugated MIM capacitor configured as described herein may exhibit, in some example embodiments, a fourfold or greater increase in capacitance per unit area as compared to a planar plate-based MIM capacitor like that of FIG. 1. As will be appreciated in light of this disclosure, greater and/or lesser improvements in capacitance per unit area may be achieved, as desired, using the techniques described herein.

In some embodiments, a MIM capacitor provided as described herein may be included in an IC, for example, to aid in power delivery for one or more integrated devices. As will be further appreciated in light of this disclosure, some embodiments can be utilized, for example, in IC fabrication in the deep-submicron process nodes (e.g., 32 nm and beyond; 22 nm node and beyond; 14 nm node and beyond; 10 nm node and beyond; etc.). However, it should be noted that the disclosed techniques generally may be considered independent of process/technology nodes and thus are not intended to be limited to use in any particular process/technology node. Other suitable uses of the disclosed techniques will depend on a given application and will be apparent in light of this disclosure.

In some cases, the disclosed techniques may be readily integrated, for example, with existing fabrication flows and may take advantage of existing equipment, knowledge, infrastructure, etc. In some cases, the disclosed techniques may be readily scaled to increase capacitance per unit area, for example: (1) by increasing the depth/height of the corrugated topography over which a given MIM capacitor is to be formed; and/or (2) by adding additional corrugated MIM capacitor layers (e.g., with each layer having a capacitance per unit area that is several times higher than that of a planar plate-based MIM capacitor like that of FIG. 1). Furthermore, some embodiments may realize reductions in cost, for example, due to: (1) avoiding or otherwise minimizing involvement of additional/unnecessary lithographic operations; and/or (2) producing a desired surface topography using a passivation layer that may be present already in a given IC. Still further, some embodiments may benefit from improvements, for example, in high-κ dielectric materials (e.g., leakage, thickness, dielectric constant, etc.).

As will be further appreciated in light of this disclosure, and in accordance with one or more embodiments, use of the disclosed techniques may be detected, for example, by cross-section analysis and/or materials analysis of a given IC or other device which includes a MIM capacitor structure generally configured as described herein.

Methodology and Structure

FIGS. 2-9 illustrate a process flow for forming an IC 100 in accordance with an embodiment of the present invention. As will be appreciated in light of this disclosure, at any portion of the described process flow, IC 100 may include additional, fewer, and/or different elements or components from those here described, and the claimed invention is not intended to be limited to any particular IC 100 configurations—initial, intermediate, and/or final—but can be used with numerous configurations in numerous applications.

Figure 2:
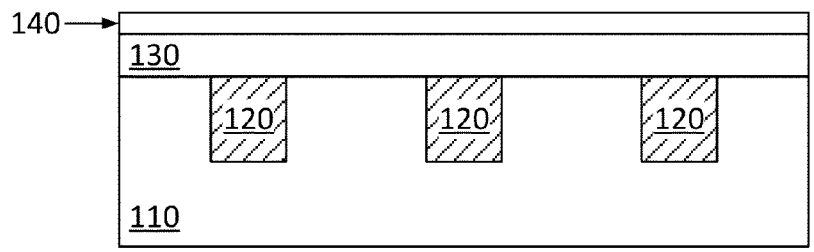
FIG. 2 is a side cross-sectional view of an integrated circuit (IC) configured in accordance with an embodiment of the present invention.

The process flow may begin as in FIG. 2, which is a side cross-sectional view of an integrated circuit (IC) 100 configured in accordance with an embodiment of the present invention. As can be seen, IC 100 may include a layer of insulator material (e.g., an inter-layer dielectric or ILD) 110. The disclosed techniques can be implemented with any of a wide variety of ILD 110 insulator materials (e.g., low-κ, high-κ, or otherwise). For instance, in some example embodiments, ILD 110 may comprise one or more of: (1) an oxide, such as silicon dioxide ($SiO_2$), silicon oxide (SiO), carbon-doped $SiO_{2, etc.}$; (2) a nitride, such as silicon nitride ($Si_3N_4$), etc.; (3) a polymer such as benzocyclobutene (BCB), a photo-definable resist (permanent or otherwise) such as SU-8, etc.; (4) a phosphosilicate glass (PSG); (5) a fluorosilicate glass (FSG); (6) an organosilicate glass (OSG), such as silsesquioxane, siloxane, etc.; (7) a combination of any of the aforementioned; and/or (8) any other suitable dielectric material capable of providing a desired degree of insulation, as will be apparent in light of this disclosure. In some embodiments, ILD 110 may be substantially non-porous, whereas in some other embodiments, ILD 110 may be provided with any degree of porosity, as desired for a given target application or end-use.

In some cases, ILD 110 may be deposited, for example, on a substrate, wafer, or other suitable surface, as desired. As will be appreciated in light of this disclosure, any of a wide range of suitable deposition techniques may be utilized, such as, but not necessarily limited to: physical vapor deposition (PVD); chemical vapor deposition (CVD); spin coating/spin-on deposition (SOD); and/or a combination of any of the aforementioned. As will be further appreciated, ILD 110 may be provided with any given thickness, as desired for a given target application or end-use. Other suitable configurations, materials, deposition techniques, and/or thicknesses for ILD 110 will depend on a given application and will be apparent in light of this disclosure.

In some cases, ILD 110 may have disposed therein one or more interconnects 120. In some instances, a plurality of ILD 110 layers each having one or more interconnects 120 may be provided. In accordance with some embodiments, a given interconnect 120 may comprise any of a wide range of electrically conductive metals, such as, but not necessarily limited to: copper (Cu); aluminum (Al); silver (Ag); nickel (Ni); gold (Au); titanium (Ti); tungsten (W); ruthenium (Ru); cobalt (Co); chromium (Cr); iron (Fe); hafnium (Hf); tantalum (Ta); vanadium (V); molybdenum (Mo); palladium (Pd); platinum (Pt); and/or an alloy or combination of any of the aforementioned. Further note that the interconnect materials may be metallic or non-metallic and may include polymeric materials, in some instances. To this end, any material having a suitable degree of electrical conductivity can be used for the one or more interconnects 120 of IC 100. Also, in some instances, it may be desirable to include a barrier layer and/or an adhesion layer between a given interconnect 120 and ILD 110. For instance, in some cases in which a given interconnect 120 comprises Cu, for example, it may be desirable to include between such interconnect 120 and ILD 110 a barrier and/or adhesion layer comprising a material such as, but not necessarily limited to: tantalum (Ta); tantalum nitride (TaN); titanium nitride (TiN); etc. Other suitable metals/materials for a given interconnect 120, optional barrier layer, and/or optional adhesion layer will depend on a given application and will be apparent in light of this disclosure.

In some cases, the disclosed techniques may be compatible with any of a wide variety of interconnect contexts and structures. Some example such structures may include, but are not necessarily limited to: single-damascene structures; dual-damascene structures (e.g., a line with an underlying via); anisotropic structures; isotropic structures; and/or any other desired IC structures, interconnects, or other conductive structures. Also, in accordance with an embodiment, the dimensions of a given interconnect 120 may be customized as desired for a given target application or end-use. Other suitable configurations for a given interconnect 120 will depend on a given application and will be apparent in light of this disclosure.

In some cases, ILD 110 and its one or more interconnects 120 may undergo a chemical-mechanical planarization (CMP) process or any other suitable polishing/planarization technique/process, as will be apparent in light of this disclosure. Planarization of IC 100 may be performed, for instance, to remove any undesired excess of: (1) a given interconnect 120; and/or (2) ILD 110. In some instances, IC 100 may be, for example, a partially processed IC with one or more devices and/or metal layers. Numerous suitable configurations will be apparent in light of this disclosure.

As can further be seen from FIG. 2, IC 100 may include a passivation layer 130. In some embodiments, passivation layer 130 may be deposited as a substantially conformal layer which covers the topography provided by the underlying ILD 110 and/or the one or more interconnects 120. As will be appreciated in light of this disclosure, and in accordance with one or more embodiments, passivation layer 130 may be disposed over ILD 110 using any of a wide range of deposition techniques/processes, such as, but not necessarily limited to: chemical vapor deposition (CVD); physical vapor deposition (PVD) (e.g., sputtering); spin coating/spin-on deposition (SOD); electron beam evaporation; atomic layer deposition (ALD); and/or a combination of any of the aforementioned. Other suitable deposition processes/techniques for passivation layer 130 will depend on a given application and will be apparent in light of this disclosure.

In accordance with an embodiment, passivation layer 130 may be deposited as a layer/film ranging from the thickness of a single constituent atom (i.e., a monolayer) to as thick a layer/film as desired for a given application. For instance, in some example embodiments, passivation layer 130 can be deposited with a thickness in the range of about 1000-2000 nm or greater (e.g., in the range of about 1000-1200 nm or greater, about 1200-1400 nm or greater, about 1400-1600 nm or greater, about 1600-1800 nm or greater, about 1800-2000 nm or greater, or any other sub-range within the range of about 1000-2000 nm or greater). In some other example embodiments, passivation layer 130 may be provided with a thickness in the range of about 1000 nm or less. In some cases, passivation layer 130 may have a substantially uniform thickness over such topography. However, the claimed invention is not so limited, as in some other instances, passivation layer 130 may be provided with a non-uniform or otherwise varying thickness. For instance, in some cases a first portion of passivation layer 130 may have a thickness within a first range while a second portion thereof has a thickness within a second, different range. Other suitable configurations and/or thickness ranges for passivation layer 130 will depend on a given application and will be apparent in light of this disclosure.

In accordance with an embodiment, passivation layer 130 may comprise any of a wide range of dielectric materials, including, but not necessarily limited to: (1) an oxide, such as silicon dioxide ($SiO_2$), aluminum oxide ($Al_2O_3$), etc.; (2) a nitride, such as silicon nitride ($Si_3N_4$); (3) a carbide, such as silicon carbide (SiC); (4) a carbonitride, such as silicon carbon nitride (SiCN); (5) an oxynitride, such as silicon oxynitride ($SiO_xN_y$); and/or (6) a combination of any of the aforementioned (e.g., SiCN/SiN, etc.). In some embodiments, passivation layer 130 may be configured as a combination of two or more layers of different materials. In some instances, and in accordance with some embodiments, passivation layer 130 may be graded such that its composition varies, for example, across the thickness of said layer. Other suitable materials and/or configurations for passivation layer 130 will depend on a given application and will be apparent in light of this disclosure.

As can yet further be seen from FIG. 2, in some embodiments, IC 100 optionally may include a hardmask layer 140. In some cases, hardmask layer 140 may be deposited as a substantially conformal layer which covers the topography provided by the underlying passivation layer 130. In accordance with some embodiments, hardmask layer 140 may be disposed on ILD 110 using any of a wide range of deposition techniques/processes, such as, but not necessarily limited to: chemical vapor deposition (CVD); physical vapor deposition (PVD) (e.g., sputtering); spin coating/spin-on deposition (SOD); electron beam evaporation; and/or a combination of any of the aforementioned. Other suitable deposition processes/techniques for hardmask layer 140 will depend on a given application and will be apparent in light of this disclosure.

In accordance with an embodiment, hardmask layer 140 may be deposited as a layer/film ranging from the thickness of a single constituent atom (i.e., a monolayer) to as thick a layer/film as desired for a given application. For instance, in some example embodiments, hardmask layer 140 can be deposited with a thickness in the range of about 10-1000 Å or greater (e.g., in the range of about 200-500 Å or greater, about 500-800 Å or greater, or any other sub-range in the range of about 10-1000 Å or greater). In some cases, hardmask layer 140 may have a substantially uniform thickness over such topography. However, the claimed invention is not so limited, as in some other instances, hardmask layer 140 may be provided with a non-uniform or otherwise varying thickness. For instance, in some cases a first portion of hardmask layer 140 may have a thickness within a first range while a second portion thereof has a thickness within a second, different range. In some embodiments, optional hardmask layer 140 may be implemented as a single layer, while in some other embodiments optional hardmask layer 140 may be implemented as multiple layers (e.g., a bi-layer, a tri-layer, etc.). Other suitable configurations and/or thickness ranges for hardmask layer 140 will depend on a given application and will be apparent in light of this disclosure.

In accordance with an embodiment, optional hardmask layer 140 may comprise any of a wide range of materials, such as, but not necessarily limited to: (1) silicon nitride ($Si_3N_4$); (2) silicon dioxide ($SiO_2$); (3) silicon oxynitride ($SiO_xN_y$); (4) silicon carbon nitride (SiCN); (5) a silicon-rich polymer having a Si concentration greater than or equal to about 20% (e.g., in the range of about 30-60% or greater, about 40-50% or greater, etc.), such as silsesquioxane, siloxane, etc.; (6) titanium nitride (TiN); and/or (7) a combination of any of the aforementioned. In some cases, the one or more materials comprising a given hardmask layer 140 may depend, at least in part, on the material(s) comprising the underlying passivation layer 130. Other suitable materials optional hardmask layer 140 will depend on a given application and will be apparent in light of this disclosure.

Figure 3:
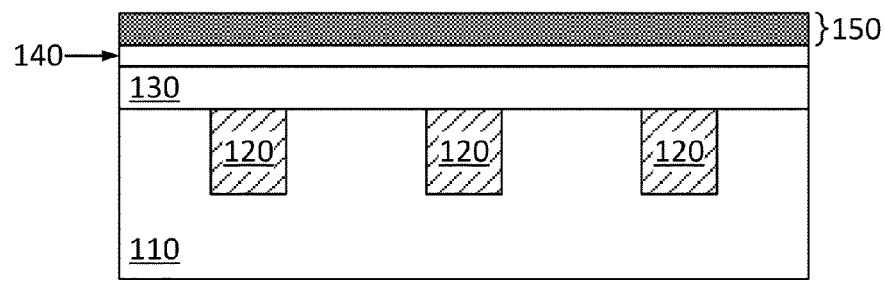
FIG. 3 illustrates the IC of FIG. 2 after depositing a directed self-assembly (DSA) layer, in accordance with an embodiment of the present invention.
Figure 4:
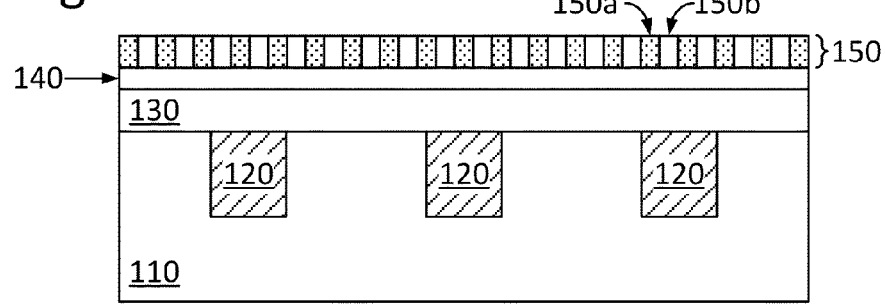
FIG. 4 illustrates the IC of FIG. 3 after treating the DSA layer, in accordance with an embodiment of the present invention.

The process flow may continue as in FIGS. 3 and 4, which illustrate the IC 100 of FIG. 2 after depositing and treating, respectively, a directed self-assembly (DSA) layer 150, in accordance with an embodiment of the present invention. In some embodiments, DSA layer 150 may comprise, for example, a block co-polymer material which self-organizes/self-assembles, for instance, when subjected to a non-subtractive treatment/process. Some such treatments may include, but are not necessarily limited to: (1) heating/baking DSA layer 150 to a sufficient temperature (e.g., in the range of about 100-450° C.); and/or (2) subjecting DSA layer 150 to a suitable solvent environment, such as an inert gas (e.g., nitrogen or $N_2$; argon or Ar; helium or He; etc.) having a partial pressure of a solvent (e.g., toluene or $C_7H_8$). Other suitable non-subtractive treatment techniques for a given DSA layer 150 will depend on a given application and will be apparent in light of this disclosure.

In any such case, upon treatment, the DSA component materials 150a and 150b of DSA layer 150 may undergo microphase separation, thus separating into two segregated phases, resulting in a generally ordered (e.g., periodic, quasi-periodic, short-range ordered, randomly ordered, etc.) nanostructure being formed, in accordance with one or more embodiments. As will be appreciated in light of this disclosure, the volume fraction of the two DSA components 150a and 150b may determine, for example, whether an array of generally cylindrical holes or an array of generally cylindrical structures results from self-organization. Numerous configurations and variations will be apparent in light of this disclosure.

To that end, and in accordance with some embodiments, some example suitable materials for DSA layer 150 may include, but are not necessarily limited to: poly(styrene-b-methyl methacrylate); poly(styrene-b-ethylene oxide); poly(styrene-b-lactide); polypropylene oxide-b-styrene-co-4-vinyl pyridine); poly(styrene-b-4-vinyl pyridine); poly(styrene-b-dimethylsiloxane); poly(styrene-b-methacrylate); poly(methyl methacrylate-b-n-nonyl acrylate); and/or a combination of any of the aforementioned. In some embodiments, DSA layer 150 may comprise a block co-polymer, for example, having two, three, four, or more blocks. In some cases, layer 150 may comprise a homopolymer and/or a blend of polymers (e.g., which themselves may be blocks, blends, homopolymers, etc.). In some example instances, DSA layer 150 may comprise a spin-on material having a colloidal suspension of nanoparticles (e.g., polystyrene latex, or PSL, spheres). In some further instances, layer 150 may include one or more non-polymer phase materials (e.g., metallic components such as beta-Ti—Cr) which segregate upon treatment (e.g., heating, exposure to solvent, etc.). In a more general sense, any material that segregates, in response to a treatment (e.g., heating, cooling, centripetal force, exposure to a suitable solvent environment, etc.), into distinct phases that can be subsequently etched with response to one another to provide a desired pattern can be used. Other suitable materials for sacrificial layer 150 will depend on factors such as a given application and available processing equipment, and will be apparent in light of this disclosure.

In some embodiments, DSA layer 150 may be deposited (e.g., prior to baking, as in FIG. 3) as a film, for example, using spin coating/spin-on deposition (SOD) or any other suitable deposition technique/process, as will be apparent in light of this disclosure. Furthermore, in accordance with some embodiments, DSA layer 150 may be deposited as a layer/film having any given thickness, as desired for a given target application or end-use. For example, prior to baking, DSA layer 150 may be a substantially conformal layer, in some instances, which covers the topography provided by optional hardmask layer 140 (if present) and/or passivation layer 130. After baking (e.g., as in FIG. 4), DSA layer 150 may have a thickness, in some embodiments, in the range of about 10-1000 Å or greater (e.g., in the range of about 200-500 Å, about 500-800 Å or greater, or any other sub-range in the range of about 10-1000 Å or greater). Other suitable configurations and/or thickness ranges for DSA layer 150 will depend on a given application and will be apparent in light of this disclosure.

Figure 5:
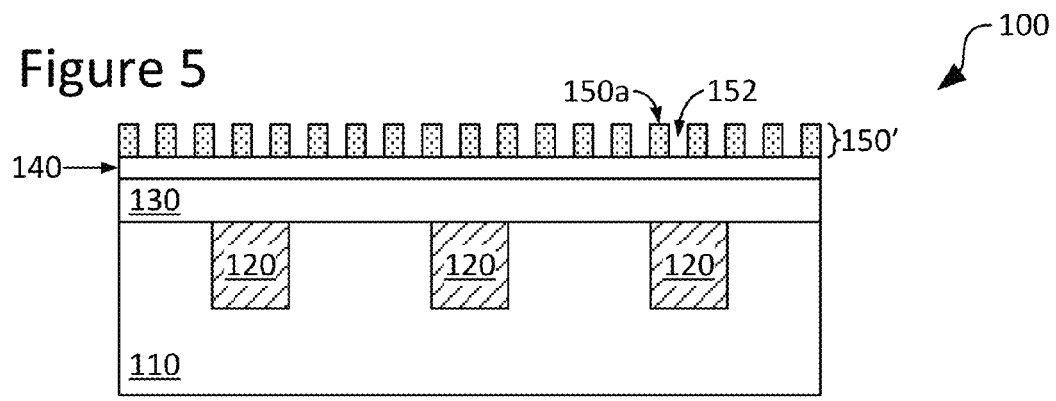
FIG. 5 illustrates the IC of FIG. 4 after selective etching thereof, in accordance with an embodiment of the present invention.
Figure 5:
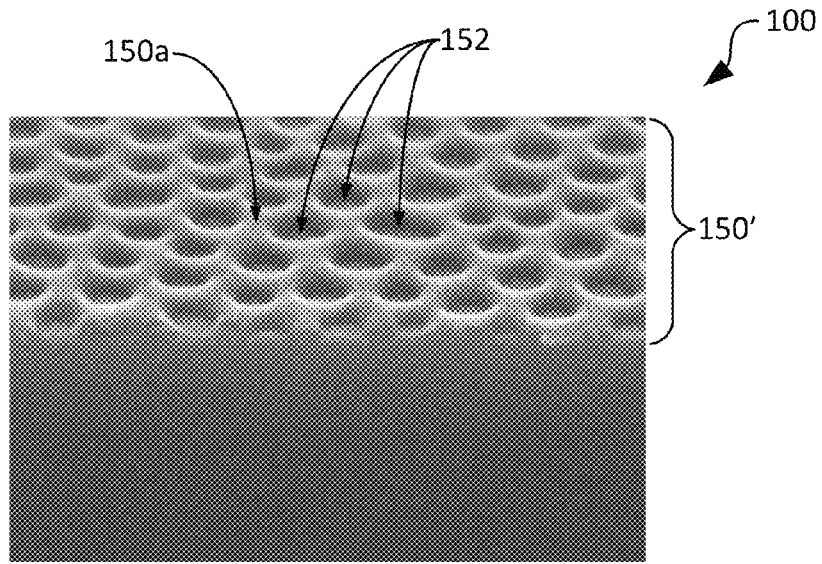

Next, the process flow may continue as in FIG. 5, which illustrates the IC 100 of FIG. 4 after selective etching thereof, in accordance with an embodiment of the present invention. As can be seen, DSA layer 150 has been selectively etched such that DSA component 150b has been removed/etched away, leaving behind DSA component 150a on the surface of IC 100. It should be noted, however, that the claimed invention is not so limited, as in some other embodiments, DSA layer 150 alternatively may be selectively etched such that DSA component 150a is removed while DSA component 150b remains on IC 100. In either case, selective etching of DSA layer 150 results in a patterned DSA layer 150' on the surface of IC 100, in accordance with an embodiment.

In some embodiments in which DSA layer 150 comprises, for example, poly(styrene-b-methyl methacrylate) (PS-b-PMMA), DSA component 150b (e.g., PMMA) may be selectively etched away, leaving behind a patterned layer 150' of DSA component 150a (e.g., PS). For example, consider FIG. 5', which is a tilted perspective scanning electron microscope (SEM) image of an example IC 100 after selective etching of a DSA layer 150 in accordance with an embodiment of the present invention. As can be seen, DSA component 150b has been selectively etched away, leaving behind a patterned layer 150' of DSA component 150a having a plurality of recesses/holes 152 formed therein.

In accordance with an embodiment, selective etching of DSA layer 150 may be performed using any of a wide variety of etch processes and chemistries. For instance, for etching away a DSA component 150b which comprises PMMA, some suitable etch processes/chemistries may include, but are not necessarily limited to: (1) a wet etch process utilizing ultraviolet (UV) exposure followed by application of acetic acid ($C_2H_4O_2$); and/or (2) a dry etch process utilizing oxygen ($O_2$) and argon (Ar) with low bias power. However, the claimed invention is not so limited, and other suitable etch processes and/or chemistries for a given DSA layer 150 will depend on a given application and will be apparent in light of this disclosure.

Figure 6:
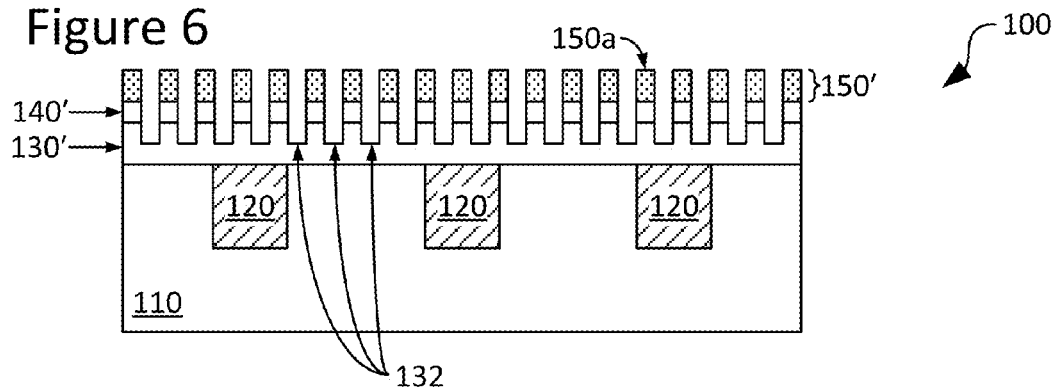
FIG. 6 illustrates the IC of FIG. 5 after further etching thereof, in accordance with an embodiment of the present invention.

Thereafter, the process flow may continue as in FIG. 6, which illustrates the IC 100 of FIG. 5 after further etching thereof, in accordance with an embodiment of the present invention. As can be seen, IC 100 has been etched, for example, to transfer the pattern of recesses/holes 152 of patterned DSA layer 150' into passivation layer 130, thus forming a patterned passivation layer 130' having a plurality of recesses 132 therein. As can further be seen, in some cases in which IC 100 includes an optional hardmask layer 140, it may be desirable to etch through the full thickness of such hardmask layer 140 (which may leave behind a patterned hardmask layer 140') prior to etching passivation layer 130 to provide the aforementioned pattern transfer.

Thus, and in accordance with an embodiment, it may be desirable to utilize an etch chemistry, for instance, which is selective to etching the material of hardmask layer 140 (when included) and/or passivation layer 130 (e.g., as opposed to the material of patterned DSA layer 150'). Some suitable etch processes/chemistries may include, but are not necessarily limited to: (1) a dry etch process utilizing a fluorine (F)-based etch chemistry (e.g., sulfur hexafluoride or $SF_6$; carbon tetrafluoride or $CF_4$; etc.); and/or (2) a dry etch process utilizing a chlorine ($Cl_2$)-based etch chemistry. However, the claimed invention is not so limited, and other suitable techniques and/or etch processes/chemistries for transferring the pattern of patterned DSA layer 150' into a patterned passivation layer 130' will depend on a given application and will be apparent in light of this disclosure.

Figure 7:
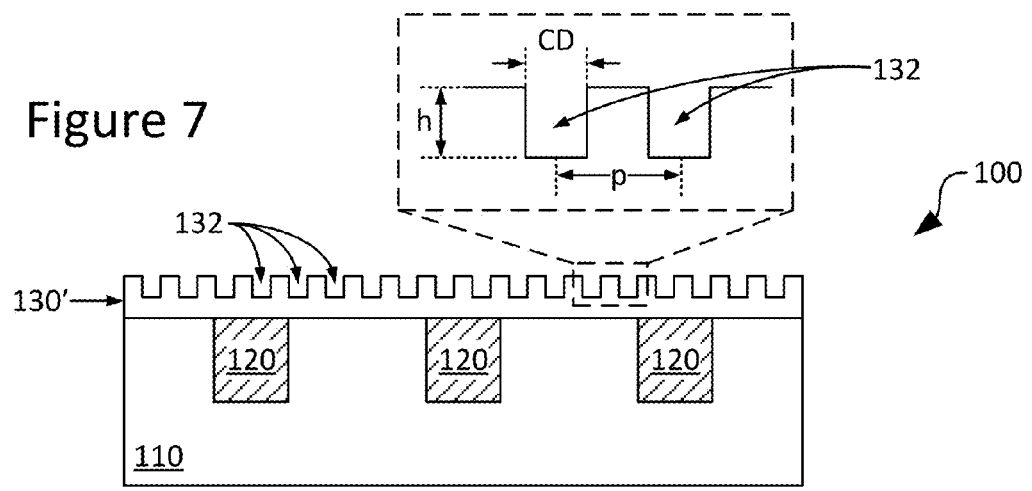
FIG. 7 illustrates the IC of FIG. 6 after further etching thereof to reveal the patterned passivation layer, in accordance with an embodiment of the present invention.
Figure 7:
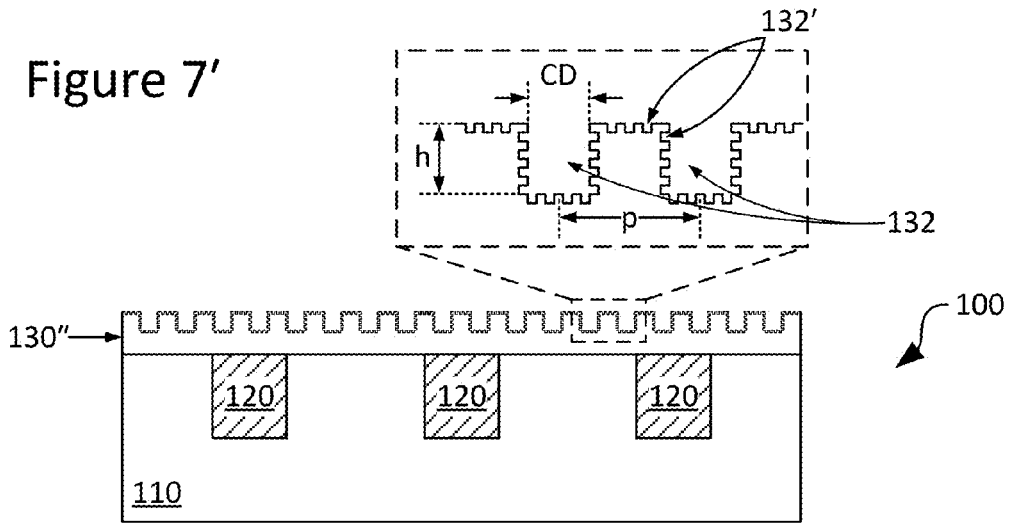

Thereafter, the process flow may continue as in FIG. 7, which illustrates the IC 100 of FIG. 6 after further etching thereof to reveal the patterned passivation layer 130', in accordance with an embodiment of the present invention. As can be seen, IC 100 may be etched to remove the patterned DSA layer 150' (e.g., to remove the remaining DSA component 150*a*) and, if present, the remaining patterned hardmask layer 140'. Thus, and in accordance with an embodiment, it may be desirable to utilize an etch chemistry, for instance, which is selective to etching the material of patterned hardmask layer 140' (if present) and/or remaining DSA component 150*a* of patterned DSA layer 150' (e.g., as opposed to the material of passivation layer 130). Some suitable etch processes and chemistries may include, but are not necessarily limited to: (1) a wet etch process utilizing a fluorine (F)-based etch chemistry or a chlorine ($Cl_2$)-based etch chemistry; (2) a dry etch process utilizing an oxygen ($O_2$)-based plasma; and/or (3) a combination of any of the aforementioned. Other suitable etch processes and/or chemistries will depend on a given application and will be apparent in light of this disclosure.

FIGS. 7" and 7''' are top-down perspective and tilted perspective SEM images, respectively, of an example IC 100 after further etching thereof to reveal the patterned passivation layer 130', in accordance with an embodiment of the present invention. As can be seen, patterned passivation layer 130' may provide IC 100 with a generally corrugated surface, for example, over which to form a MIM capacitor 200 (discussed below).

Returning to FIG. 7, the dimensions of the recesses 132 formed in passivation layer 130 may be customized for a given target application or end-use, in accordance with an embodiment. For instance, in some example cases, the diameter/width 'CD' of a given recess 132 may be in the range of about 10-100 nm or greater (e.g., in the range of about 20-40 nm or greater, about 40-60 nm or greater, about 60-80 nm or greater, or any other sub-range in the range of about 10-100 nm or greater). Also, in some example cases, the depth/height 'h' may be in the range of about 10-1000 nm or greater (e.g., in the range of about 100-400 nm or greater, about 400-700 nm or greater, about 700-1000 nm or greater, or any other sub-range in the range of about 10-1000 nm or greater). Furthermore, in some example cases, the pitch 'p' between adjacent or otherwise neighboring recesses 132 may be in the range of about 10-100 nm or greater (e.g., in the range of about 20-40 nm or greater, about 40-60 nm or greater, about 60-80 nm or greater, or any other sub-range in the range of about 10-100 nm or greater).

However, as will be further appreciated in light of this disclosure, the depth/height of a given recess 132 may depend, at least in part, on one or more of: (1) the CD of that recess 132; (2) the thickness of passivation layer 130; and/or (3) the deposition process/technique to be utilized for forming MIM capacitor structure 200 (discussed below) over patterned passivation layer 130'. In some example embodiments, a given recess 132 may be provided with an aspect ratio (e.g., ratio of depth/height 'h' to width/diameter 'CD') in the range of about 1-to-1 to 10-to-1 (e.g., about 10-to-1 or less; about 5-to-1 or less; about 2-to-1 or less; about 1-to-1 or less; etc.). Other suitable dimension ranges and/or aspect ratios for recesses 132 will depend on a given application and will be apparent in light of this disclosure.

FIG. 7' illustrates the IC of FIG. 7 after further patterning thereof, in accordance with another embodiment of the present invention. In some instances, patterned passivation layer 130' may be further patterned, for example, to provide a patterned passivation layer 130". As can be seen, patterned passivation layer 130" may have one or more recesses 132' formed therein (e.g., formed along a given recess 132). As will be appreciated in light of this disclosure, and in accordance with one or more embodiments, any of the techniques discussed herein, for example, with reference to forming recesses 132 (e.g., such as in the process flow portions discussed above regarding FIGS. 3-6) may be applied equally here in the context of forming recesses 132'. In some example cases, patterned passivation layer 130" may provide a corrugated surface characterized by two-fold corrugation over which to form a MIM capacitor 200 (discussed below). Other suitable configurations for patterned passivation layer 130" will depend on a given application and will be apparent in light of this disclosure.

Figure 8:
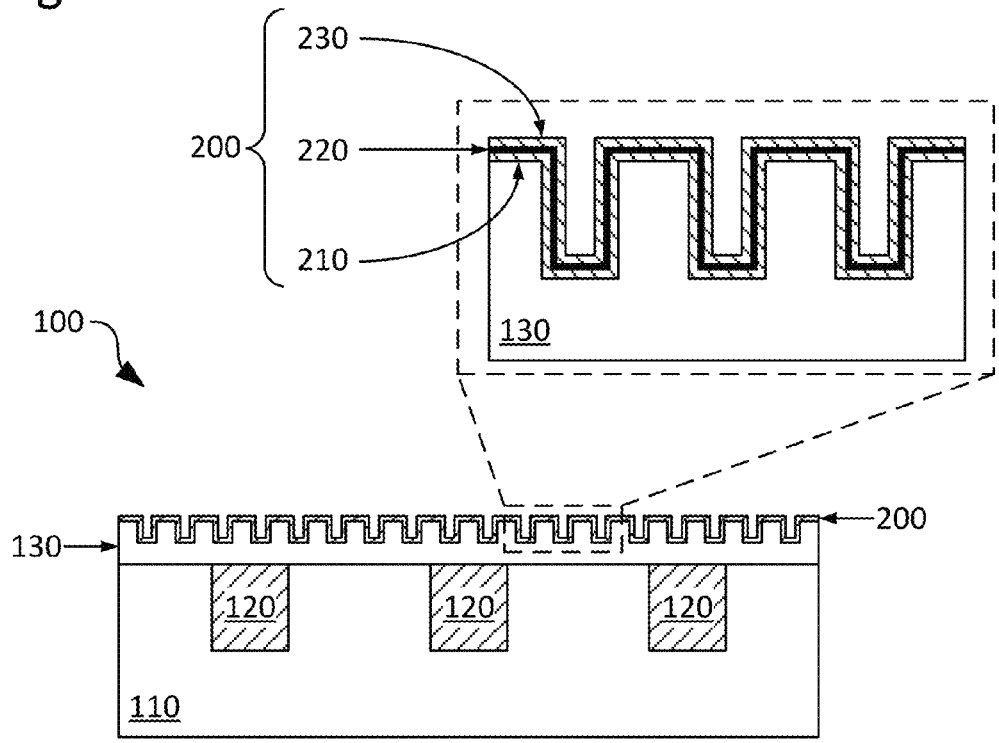
FIG. 8 illustrates the IC of FIG. 7 after deposition of a metal-insulator-metal (MIM) capacitor, in accordance with an embodiment of the present invention.

FIG. 8 illustrates the IC 100 of FIG. 7 after deposition of a MIM capacitor 200, in accordance with an embodiment of the present invention. As can be seen, MIM capacitor 200 may be generally formed, in some embodiments, as a tri-layer structure/film including, for example: (1) a lower conductive layer 210 (e.g., bottom MIM electrode); a dielectric layer 220 disposed on the lower conductive layer 210 (e.g., intermediate insulator layer); and (3) an upper conductive layer 230 (e.g., upper MIM electrode). It should be noted, however, that the claimed invention is not so limited. For instance, in some other embodiments, a given IC 100 may include a MIM capacitor 200 that further includes: (1) an additional dielectric layer (e.g., configured like dielectric layer 220) formed over upper conductive layer 230; and (2) an additional electrically conductive layer (e.g., configured like conductive layer 210/230) formed over said additional dielectric layer. Thus, in some instances, a metal-insulator-metal-insulator-metal (MIMIM) structure may be provided. As will be appreciated in light of this disclosure, and in accordance with one or more embodiments, further stacking/layering of adjacent pairs of dielectric and electrically conductive layers may be provided to expand the configuration of MIM capacitor 200, as desired for a given application or end-use. Other suitable configurations for MIM capacitor 200 will depend on a given application and will be apparent in light of this disclosure.

In accordance with one or more embodiments, lower conductive layer 210 and/or upper conductive layer 230 may comprise any of a wide range of electrically conductive materials, such as, but not necessarily limited to: titanium (Ti); titanium nitride (TiN); tantalum (Ta); ruthenium (Ru); and/or a combination of any of the aforementioned. Furthermore, and in accordance with one or more embodiments, dielectric layer 220 may comprise any of a wide range of high-κ dielectric materials, including, but not necessarily limited to: zirconium dioxide ($ZrO_2$); tantalum pentoxide ($Ta_2O_5$); aluminum oxide ($Al_2O_3$); titanium dioxide ($TiO_2$); hafnium oxide ($HfO_2$); lanthanum oxide ($La_2O_3$); strontium titanate ($SrTiO_3$); and/or a combination of any of the aforementioned. Other suitable materials for lower conductive layer 210, dielectric layer 220, and/or upper conductive layer 230 will depend on a given application and will be apparent in light of this disclosure.

Also, as will be appreciated in light of this disclosure, and in accordance with one or more embodiments, any of the various layers of MIM capacitor 200 may be deposited or otherwise formed over the patterned passivation layer 130' using any of a wide range of techniques. Some example suitable techniques may include, but are not necessarily limited to: sputter deposition; chemical vapor deposition (CVD); atomic layer deposition (ALD); and/or a combination thereof. Other suitable deposition techniques for lower conductive layer 210, dielectric layer 220, and/or upper conductive layer 230 will depend on a given application and will be apparent in light of this disclosure.

In accordance with an embodiment, lower conductive layer 210 may be provided with any given thickness, as desired for a given target application or end-use. For example, in some embodiments, lower conductive layer 210 may have a thickness in the range of about 10-50 Å or greater (e.g., in the range of about 10-30 Å or greater, about 30-50 Å or greater, or any other sub-range in the range of about 10-50 Å or greater). In some cases, lower conductive layer 210 may be provided as a film/layer that is substantially conformal to the topography provided by the underlying patterned passivation layer 130'. Also, as will be appreciated in light of this disclosure, it may be desirable to ensure that the thickness of lower conductive layer 210 is not so excessive that it: (1) fully fills in a given recess 132 or otherwise occludes the entry of a given recess 132; and/or (2) prevents dielectric layer 220 and/or upper conductive layer 230 from being provided at a given desired thickness. Other suitable thickness ranges and/or configurations for lower conductive layer 210 will depend on a given application and will be apparent in light of this disclosure.

In accordance with an embodiment, dielectric layer 220 may be provided with any given thickness, as desired for a given target application or end-use. For example, in some embodiments, dielectric layer 220 may have a thickness in the range of about 10-50 Å or greater (e.g., in the range of about 10-30 Å or greater, about 30-50 Å or greater, or any other sub-range in the range of about 10-50 Å or greater). In some cases, dielectric layer 220 may be provided as a film/layer that is substantially conformal to the topography provided by the underlying lower conductive layer 210; however, the claimed invention is not so limited, as in some other cases, dielectric layer 220 may not be provided as a conformal layer. Also, as will be appreciated in light of this disclosure, it may be desirable to ensure that the thickness of dielectric layer 220 is not so excessive that it: (1) fully fills in a given recess 132 or otherwise occludes the entry of a given recess 132; and/or (2) prevents lower conductive layer 210 and/or upper conductive layer 230 from being provided at a given desired thickness. Other suitable thickness ranges and/or configurations for dielectric layer 220 will depend on a given application and will be apparent in light of this disclosure.

In accordance with an embodiment, upper conductive layer 230 may be provided with any given thickness, as desired for a given target application or end-use. For example, in some embodiments, upper conductive layer 230 may have a thickness in the range of about 1-20 Å or greater (e.g., in the range of about 1-10 Å or greater, about 10-20 Å or greater, or any other sub-range in the range of about 1-20 Å or greater). In some cases, upper conductive layer 230 may be provided as a film/layer that is substantially conformal to the topography provided by the underlying dielectric layer 220. Also, as will be appreciated in light of this disclosure, it may be desirable to ensure that the thickness of upper conductive layer 230 is not so excessive that it prevents lower conductive layer 210 and/or dielectric layer 220 from being provided at a given desired thickness. Other suitable thickness ranges and/or configurations for upper conductive layer 230 will depend on a given application and will be apparent in light of this disclosure.

Figure 9:
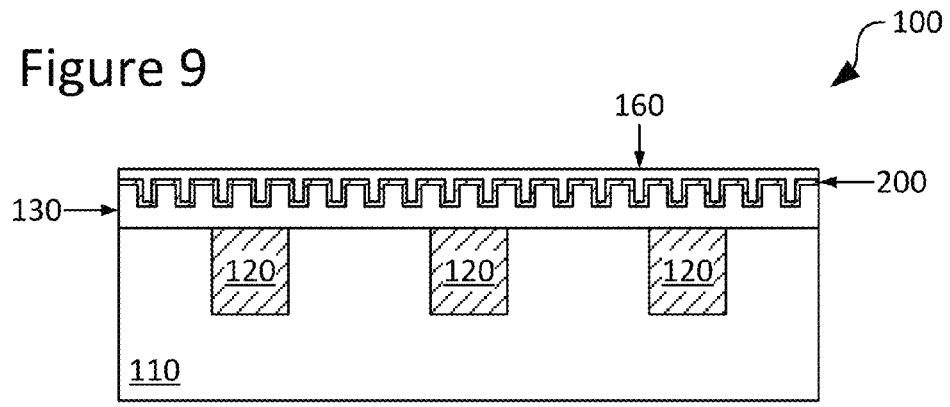
FIG. 9 illustrates the IC of FIG. 8 after deposition of a passivation layer, in accordance with an embodiment of the present invention.

FIG. 9 illustrates the IC 100 of FIG. 8 after deposition of a passivation layer 160, in accordance with an embodiment of the present invention. As can be seen, in some embodiments, passivation layer 160 may be deposited or otherwise formed over the topography provided, in part or in whole, by MIM capacitor 200. As will be appreciated in light of this disclosure, and in accordance with an embodiment, passivation layer 160 may comprise any of the various materials and/or be deposited using any of the various deposition techniques/processes noted above, for example, with reference to passivation layer 130. In some cases, passivation layer 160 may be the same material as passivation layer 130, and therefore just be an extended passivation layer 130 in which MIM capacitor 200 is formed.

As will be further appreciated in light of this disclosure, and in accordance with an embodiment, the thickness of passivation layer 160 may be customized for a given target application or end-use. In some embodiments, passivation layer 160 may be deposited, for example, as a substantially conformal layer over the topography provided by upper conductive layer 230 of MIM capacitor 200. In some other embodiments, passivation layer 160 may be deposited, for instance, using planarizing techniques (e.g., spin coating/ spin-on deposition, or SOD). In some instances in which a conformal deposition process is utilized, planarization of passivation layer 160 may be provided, for example, using a chemical-mechanical planarization (CMP) process or any other suitable polishing/planarization technique/process, as will be apparent in light of this disclosure. In some cases, passivation layer 160 and passivation layer 130 may be configured as a single layer within which MIM capacitor 200 may be provided. Other suitable materials, thickness ranges, and/ or deposition techniques/processes for passivation layer 160 will depend on a given application and will be apparent in light of this disclosure.

In some cases, the disclosed techniques may be used, in accordance with some embodiments, to pattern passivation layer 160. In some such cases, a MIM capacitor 200 may be formed over a given passivation layer 160 provided with a corrugated surface, as variously described herein.

Also, in some embodiments, additional ILD 110 layers and/or interconnect(s) 120 can be included over a given MIM capacitor 200. In some such instances, one or more structures (e.g., vias, etc.) may be included, for example, to electrically couple conductive layers 210 and/or 230 (or other conductive layer) of a given MIM capacitor 200 to other portion(s) of IC 100.

Additional Techniques and Considerations

Figure 10:
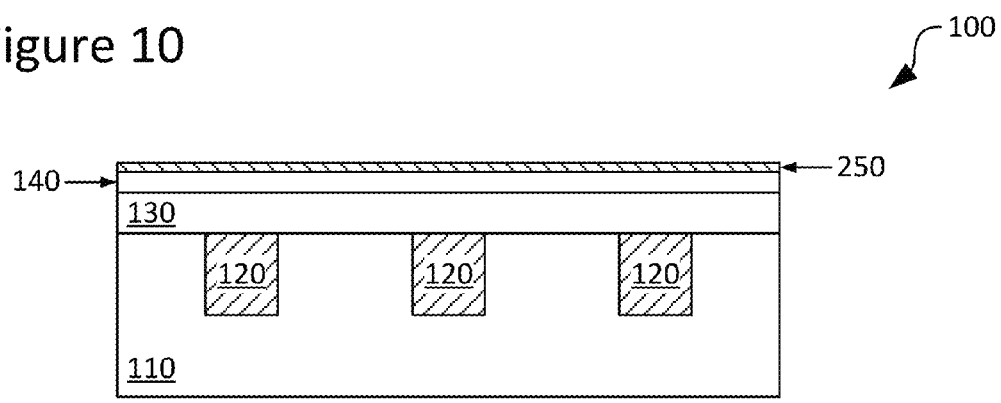
FIG. 10 illustrates the IC of FIG. 2 after depositing a sacrificial layer, in accordance with an embodiment of the present invention.
Figure 11:
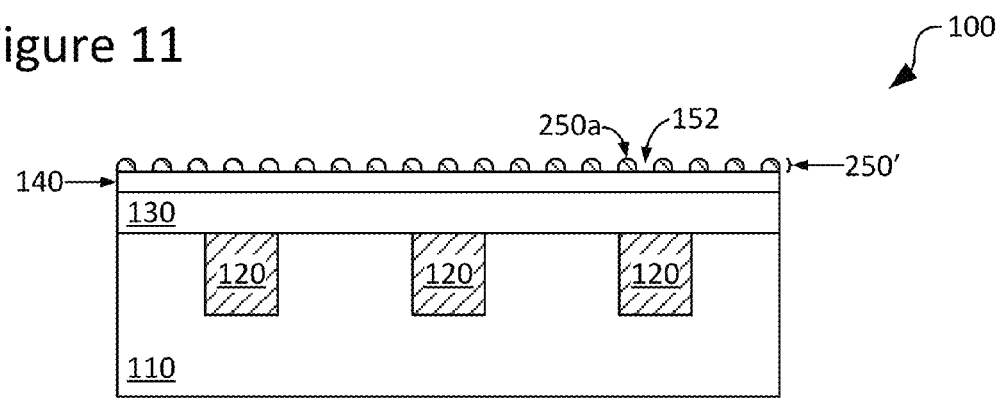
FIG. 11 illustrates the IC of FIG. 2 after heating the sacrificial layer, in accordance with an embodiment of the present invention.
Figure 12:
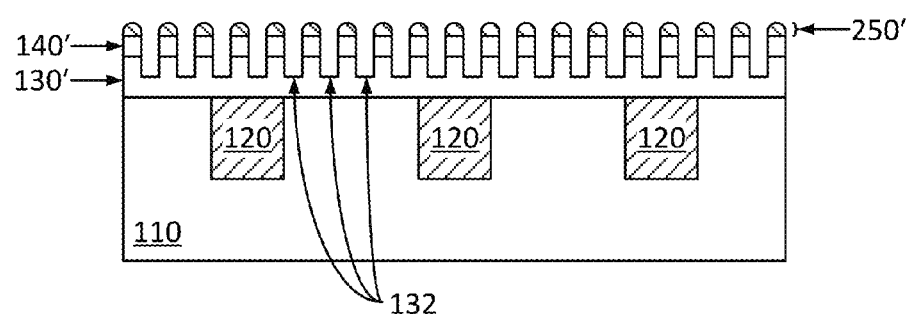
FIG. 12 illustrates the IC of FIG. 11 after etching thereof, in accordance with an embodiment of the present invention.

FIGS. 10-12 illustrate portions of a process flow for forming an IC 100 in accordance with another embodiment of the present invention. As will be appreciated in light of this disclosure, and in accordance with an embodiment, the process flow portions depicted in FIGS. 10-12 generally may be implemented, in some instances, instead of the portions of the process flow represented in FIGS. 3-6 (discussed above).

FIGS. 10 and 11 illustrate the IC 100 of FIG. 2 after depositing and heating, respectively, a sacrificial layer 250, in accordance with an embodiment of the present invention. As can be seen, sacrificial layer 250 may be deposited or otherwise formed, in some embodiments, over an underlying hardmask layer 140 (if optionally implemented) and/or passivation layer 130. In accordance with one or more embodiments, sacrificial layer 250 may comprise a material which undergoes agglomeration/de-wetting, for example, upon application of sufficient heat. For instance, in some embodiments, sacrificial layer 250 may agglomerate/de-wet into a patterned sacrificial layer 250' including a plurality of coalesced, isolated islands/bodies 250a having recesses 152 there between. In some embodiments, agglomeration/de-wetting of sacrificial layer 250 may occur, for example, when heated to a temperature in the range of about 100-450° C. To that end, some example suitable materials may include, but are not necessarily limited to: copper (Cu); silver (Ag); silicon (Si); germanium (Ge); platinum (Pt); a polymer-based material, such as polystyrene on $SiO_2$, etc.; and/or a combination of any of the aforementioned. In some embodiments, the underlying hardmask layer 140 (if optionally implemented) and/or passivation layer 130 over which sacrificial layer 250 may be deposited may comprise, for example: silicon dioxide ($SiO_2$); silicon carbide (SiC); silicon carbon nitride (SiCN); silicon sesquinitride ($Si_2N_3$); organosilicate glass (SiCOH); and/or a combination of any of the aforementioned. Other suitable materials for sacrificial layer 250 will depend on a given application and will be apparent in light of this disclosure.

In accordance with an embodiment, sacrificial layer 250 may be deposited/formed using any of a wide variety of techniques, such as, but not necessarily limited to: chemical vapor deposition (CVD); physical vapor deposition (PVD) (e.g., sputtering); spin coating/spin-on deposition (SOD); electron beam evaporation; and/or a combination of any of the aforementioned. Also, in some example embodiments, sacrificial layer 250 may be provided as film/layer having a thickness, for instance, in the range of about 1-150 nm or greater (e.g., in the range of about 1-50 nm or greater, about 50-100 nm or greater, about 100-150 nm or greater, or any other sub-range in the range of about 1-150 nm or greater). In some instances, sacrificial layer 250 may be implemented without any underlying adhesion layer (e.g., to aid in providing a desired degree of agglomeration/de-wetting). Other suitable configurations, deposition techniques, and/or thickness ranges for sacrificial layer 250 will depend on a given application and will be apparent in light of this disclosure.

After a sufficiently agglomerated/de-wetted sacrificial layer 250' has been provided, the process flow may continue as in FIG. 12, which illustrates the IC 100 of FIG. 11 after etching thereof, in accordance with an embodiment of the present invention. As can be seen, IC 100 has been etched, for example, to transfer the pattern of recesses/holes 152 of patterned sacrificial layer 250' into passivation layer 130, thus forming a patterned passivation layer 130' having a plurality of recesses 132 therein. As can further be seen, in some cases in which IC 100 includes an optional hardmask layer 140, it may be desirable to etch through the full thickness of such hardmask layer 140 (which may leave behind a patterned hardmask layer 140') prior to etching passivation layer 130 to provide the aforementioned pattern transfer. As will be appreciated in light of this disclosure, and in accordance with some embodiments, a dry etch process utilizing any of the suitable etch chemistries discussed above in the context of FIG. 6 may be used.

Still further variations of the process flow of FIGS. 2-9 may be provided, in accordance with one or more embodiments of the present invention. For example, in some embodiments, lithographic techniques/processes may be utilized to produce a generally corrugated topography over which MIM capacitor 200 may be deposited/formed. To that end, in some cases, the portions of the process flow depicted in FIGS. 3-5 may be replaced, for example, by a spin coating/spin-on deposition (SOD) of a resist material, exposure of such resist material, and application of an appropriate developing process. Further variations and configurations will be apparent in light of this disclosure.

Example Implementation Data

As previously noted, some embodiments of the present invention may exhibit increased capacitance per unit of die area as compared to existing designs/approaches (such as the plate-based based MIM capacitor of FIG. 1). In some cases, the effective capacitor area may be increased without increasing (or with negligible increase to) fabrication cost.

Figure 13:
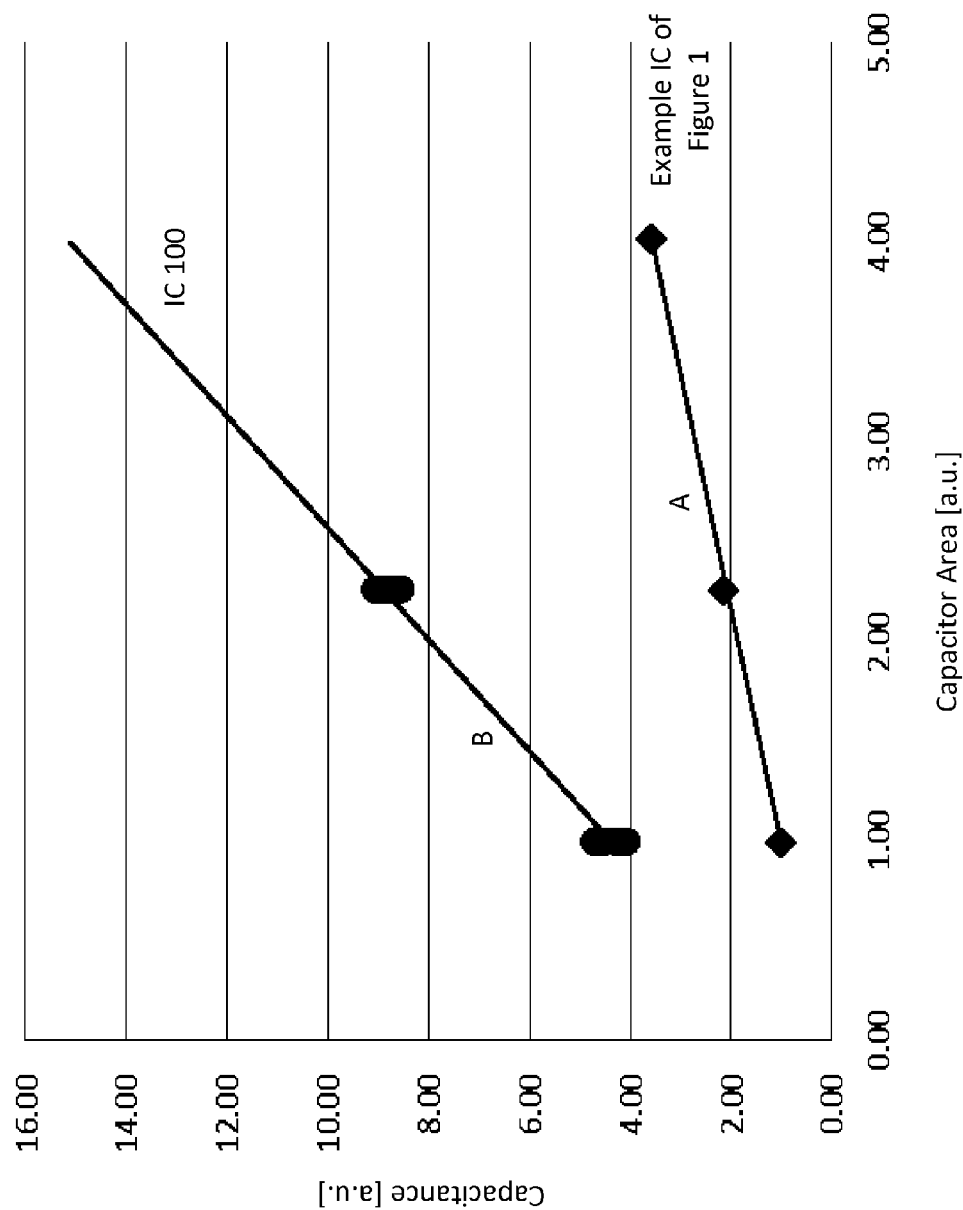
FIG. 13 is a graph of experimental data showing capacitance as a function of capacitor area for an existing integrated circuit configured like that of FIG. 1 and for an IC configured in accordance with an embodiment of the present invention.

FIG. 13 is a graph of experimental data showing capacitance as a function of capacitor area for an existing IC configured like that of FIG. 1 and for an IC 100 configured in accordance with an embodiment of the present invention. In the figure, Line A corresponds to the capacitance of a plate-based MIM capacitor of the example IC of FIG. 1, whereas Line B corresponds to the capacitance of a MIM capacitor 200 of an IC 100, in accordance with one example embodiment. Also, within the context of FIG. 10, 'capacitor area' generally refers to: (1) the overlap in area of the upper and lower electrode plates of the plate-based MIM capacitor of the IC of FIGS. 1; and (2) the overlap in area of the upper conductive layer 230 and lower conductive layer 210 of a MIM capacitor 200 of an IC 100, in accordance with one example embodiment.

As can be seen, the ratio of the slopes of Lines A and B of FIG. 13 effectively shows that, in one example embodiment, a greater than fourfold gain in capacitance may be achieved utilizing the disclosed techniques. In further detail, the capacitance improvements per unit of die area may be estimated, for example, by the following relationship:

$$C = C_{Planar}\left(1 + \frac{2\pi}{\sqrt{3}} \cdot \frac{CD \cdot h}{p^2}\right),$$

where: 'C' is the capacitance per unit area for the MIM capacitor 200 of IC 100; '$C_{Planar}$' is the capacitance per unit area per pair of the flat/non-corrugated MIM plates for the IC of FIG. 1; 'CD' is the diameter/width of the recesses 132 in patterned passivation layer 130'; 'p' is the pitch of neighboring/adjacent recesses 132 in patterned passivation layer 130'; 'h' is the height/depth of the recesses 132 in patterned passivation layer 130'; and the value $$\frac{2\pi}{\sqrt{3}} \cong 3.63$$

can be derived from geometry and applies, for example, to a hexagonal close-packed (hcp) array of recesses 132. As will be appreciated in light of this disclosure, alterations/additions to the above-described relationship may be applicable in some instances (e.g., depending on geometries considered, etc.).

If the aspect ratio (AR) of a given recess 132 is defined as $$AR = \frac{h}{CD}$$

and the diameter/width is $$CD = \frac{p}{2}$$

(e.g., the recesses 132 are formed in patterned passivation layer 130' at one-half the pitch), then the aforementioned relationship can be simplified to:

$$C = C_{Planar}(1 + 0.9 \cdot AR).$$

Thus, for an AR greater than 3, for example, the capacitance gain provided using the disclosed techniques may be greater than or equal to about four (or more) times the capacitance which may be provided by a typical plate-based MIM capacitor like that of FIG. 1. However, it should be noted that the claimed invention is not so limited, as in some other embodiments, greater and/or lesser gains in capacitance may be provided using the disclosed techniques, as desired for a given target application or end-use.

Example System

Figure 14:
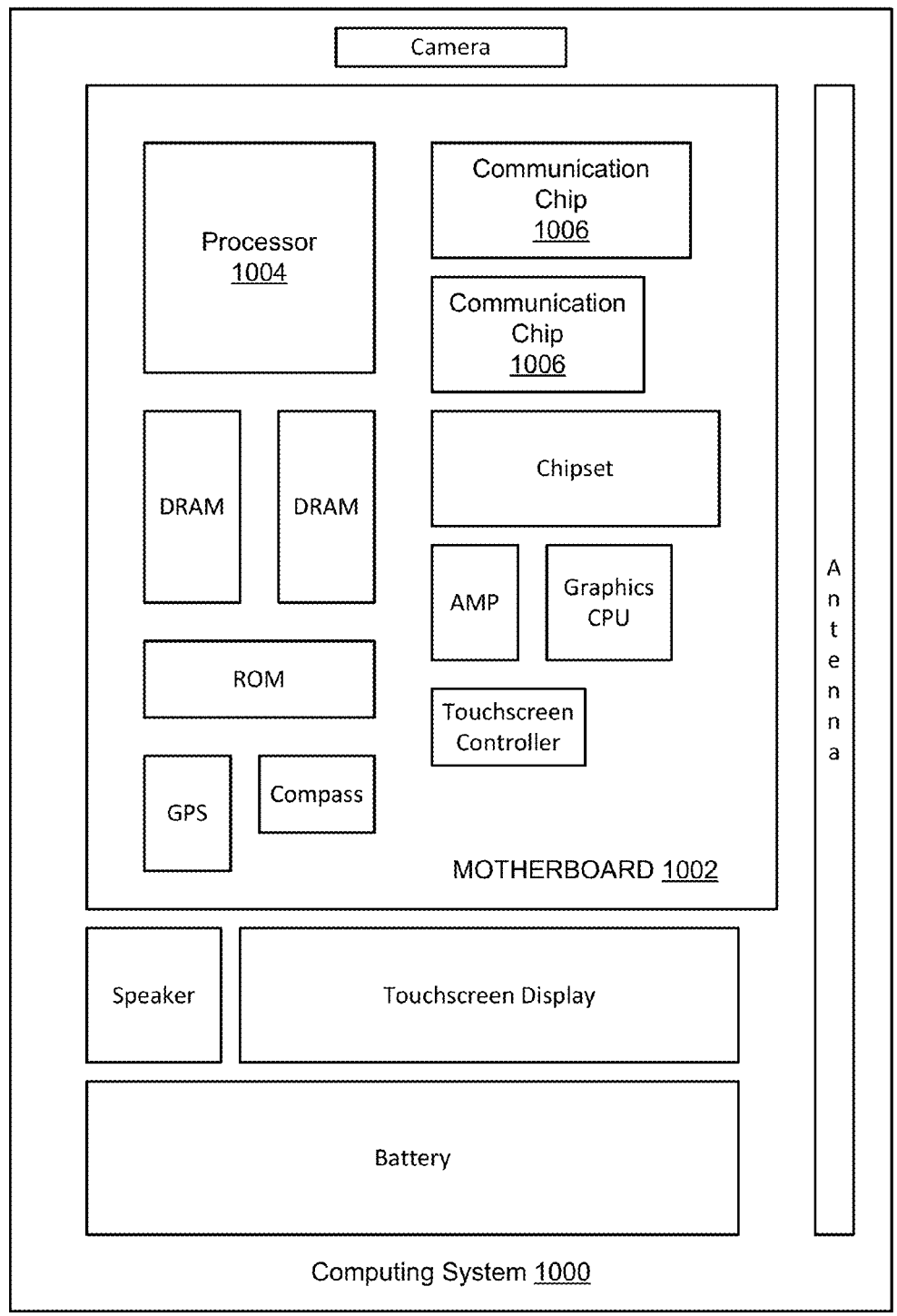
FIG. 14 illustrates a computing system implemented with integrated circuit structures or devices formed using the disclosed techniques for forming metal-insulator-metal (MIM) capacitors in accordance with an example embodiment of the present invention.

FIG. 14 illustrates a computing system 1000 implemented with integrated circuit structures or devices formed using the disclosed techniques for forming MIM capacitors in accordance with an example embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk, digital versatile disk (DVD), and so forth). Any of the components included in computing system 1000 may include one or more integrated circuit structures or devices formed using the disclosed techniques for forming MIM capacitors in accordance with an example embodiment of the present invention. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard circuitry that is implemented with one or more integrated circuit structures or devices formed using the disclosed techniques for forming MIM capacitors, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques for forming MIM capacitors as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques for forming MIM capacitors, as variously described herein.

Numerous embodiments will be apparent in light of this disclosure. One example embodiment of the present invention provides a method of forming an integrated circuit, the method including depositing a first dielectric layer, depositing a sacrificial masking layer of self-organizing material over the first dielectric layer, patterning the masking layer, wherein the patterning includes a non-subtractive process that causes the masking layer to self-organize into distinct structures, patterning the first dielectric layer using the patterned masking layer, and depositing a metal-insulator-metal (MIM) capacitor over the patterned first dielectric layer. In some cases, the non-subtractive process causes the masking layer to segregate into at least a first phase and a second phase. In some cases, the masking layer comprises at least one of poly(styrene-b-methyl methacrylate), poly(styrene-b-ethylene oxide), poly(styrene-b-lactide), polypropylene oxide-b-styrene-co-4-vinyl pyridine), poly(styrene-b-4-vinyl pyridine), poly(styrene-b-dimethylsiloxane), poly(styrene-b-methacrylate), poly(methyl methacrylate-b-n-nonyl acrylate), beta-Ti—Cr, polystyrene latex (PSL) spheres, and/or a combination thereof. In some cases, the non-subtractive process includes heating the masking layer to a temperature in the range of about 100-450° C. In some cases, the non-subtractive process includes exposing the masking layer to a solvent environment including at least one of toluene ($C_7H_8$), nitrogen ($N_2$), argon (Ar), and/or helium (He). In some instances, after the non-subtractive process, patterning the masking layer further includes selectively etching away a segregated component material of the masking layer to form a pattern of recesses in the masking layer. In some such instances, after the first dielectric layer is patterned using the patterned masking layer, the method further includes removing the remaining masking layer. In some cases, the masking layer comprises a material which coalesces into isolated islands when heated to a temperature in the range of about 100-450° C. In some example cases, the masking layer comprises at least one of copper (Cu), silver (Ag), silicon (Si), germanium (Ge), platinum (Pt), polystyrene on silicon dioxide ($SiO_2$), and/or a combination thereof. In some instances, patterning the masking layer does not require any etching. In some cases, the MIM capacitor includes a first conductive layer formed over the first dielectric layer, a second dielectric layer formed over the first conductive layer, and a second conductive layer formed over the second dielectric layer. In some such cases, at least one of the first conductive layer and/or the second conductive layer comprises at least one of titanium (Ti), titanium nitride (TiN), tantalum (Ta), and/or a combination thereof. In some cases, the second dielectric layer comprises at least one of zirconium dioxide ($ZrO_2$), tantalum pentoxide ($Ta_2O_5$), aluminum oxide ($Al_2O_3$), titanium dioxide ($TiO_2$), hafnium oxide ($HfO_2$), lanthanum oxide ($La_2O_3$), strontium titanate ($SrTiO_3$), and/or a combination thereof. In some example instances, after depositing the MIM capacitor over the patterned first dielectric layer, the method further includes depositing a third dielectric layer over the MIM capacitor. In some such instances, at least one of the first dielectric layer and/or the third dielectric layer is a passivation layer. In some cases, before depositing the masking layer over the first dielectric layer, the method further includes depositing a hardmask layer between the first dielectric layer and the masking layer. In some such cases, the hardmask layer comprises at least one of silicon nitride ($Si_3N_4$), silicon dioxide ($SiO_2$), silicon oxynitride ($SiO_xN_y$), a silicon (Si)-rich polymer having a Si concentration greater than or equal to about 20%, titanium nitride (TiN), and/or a combination thereof. In some instances, the patterned first dielectric layer has a substantially corrugated profile and the MIM capacitor is substantially conformal to said profile. In some instances, the patterned first dielectric layer has a substantially corrugated profile including at least one recess having a topography which itself is corrugated. In some cases, an integrated circuit formed by the method is provided. In some such cases, a mobile computing device including the integrated circuit is provided.

Another example embodiment of the present invention provides a method of forming an integrated circuit, the method including depositing a first dielectric layer, depositing a sacrificial layer of block co-polymer material over the first dielectric layer, treating the layer of block co-polymer material with a non-subtractive process to cause phase separation thereof, selectively etching the phase-separated layer of block co-polymer material to remove a phase thereof, thereby forming a pattern of recesses therein, etching to transfer the pattern of recesses into the first dielectric layer, etching to remove the remaining layer of block co-polymer material, and depositing a metal-insulator-metal (MIM) capacitor over the patterned first dielectric layer. In some cases, the patterned first dielectric layer has a substantially corrugated profile and the MIM capacitor is substantially conformal to said profile. In some instances, the block co-polymer material comprises at least one of poly(styrene-b-methyl methacrylate), poly(styrene-b-ethylene oxide), poly(styrene-b-lactide), poly(propylene oxide-b-styrene-co-4-vinyl pyridine), poly(styrene-b-4-vinyl pyridine), poly(styrene-b-dimethylsiloxane), poly(styrene-b-methacrylate), poly(methyl methacrylate-b-n-nonyl acrylate), and/or a combination thereof.

Another example embodiment of the present invention provides a method of forming an integrated circuit, the method including depositing a first dielectric layer, depositing a sacrificial layer over the first dielectric layer, treating the sacrificial layer with a non-subtractive process to cause agglomeration thereof, wherein agglomeration of the sacrificial layer results in a pattern of coalesced bodies having recesses there between, etching to transfer the pattern into the first dielectric layer, etching to remove the sacrificial layer, and depositing a metal-insulator-metal (MIM) capacitor over the patterned first dielectric layer. In some instances, agglomeration of the sacrificial layer occurs at a temperature in the range of about 100-450° C. In some example cases, the sacrificial layer comprises at least one of copper (Cu), silver (Ag), silicon (Si), germanium (Ge), platinum (Pt), and/or polystyrene on silicon dioxide ($SiO_2$). In some cases, the patterned first dielectric layer has a substantially corrugated profile and the MIM capacitor is substantially conformal to said profile.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method of forming an integrated circuit, the method comprising:
   depositing a first dielectric layer;
   depositing a hardmask layer over the first dielectric layer;
   depositing a sacrificial masking layer of self-organizing material over the hardmask layer;
   patterning the masking layer, wherein the patterning includes a non-subtractive process that causes the masking layer to self-organize into distinct structures;
   patterning the first dielectric layer using the patterned masking layer; and
   depositing a metal-insulator-metal (MIM) capacitor over the patterned first dielectric layer.

2. The method of claim 1, wherein the non-subtractive process causes the masking layer to segregate into at least a first component material of a first phase and a second component material of a second phase.

3. The method of claim 1, wherein the masking layer comprises at least one of poly(styrene-b-methyl methacrylate), poly(styrene-b-ethylene oxide), poly(styrene-b-lactide), poly(propylene oxide-b-styrene-co-4-vinyl pyridine), poly(styrene-b-4-vinyl pyridine), poly(styrene-b-dimethylsiloxane), poly(styrene-b-methacrylate), poly(methyl methacrylate-b-n-nonyl acrylate), beta-Ti—Cr, polystyrene latex (PSL) spheres, and a combination thereof.

4. The method of claim 1, wherein the non-subtractive process includes heating the masking layer to a temperature in the range of about 100-450° C.

5. The method of claim 1, wherein the non-subtractive process includes exposing the masking layer to a solvent environment including at least one of toluene ($C_7H_8$), nitrogen ($N_2$), argon (Ar), and helium (He).

6. The method of claim 1, wherein after the non-subtractive process, patterning the masking layer further comprises:
selectively etching away a segregated component material of the masking layer to form a pattern of recesses in the masking layer.

7. The method of claim 6, wherein after the first dielectric layer is patterned using the patterned masking layer, the method further comprises:
removing the remaining masking layer.

8. The method of claim 1, wherein the masking layer comprises a material which coalesces into isolated islands when heated to a temperature in the range of about 100-450° C.

9. The method of claim 1, wherein the masking layer comprises at least one of copper (Cu), silver (Ag), silicon (Si), germanium (Ge), platinum (Pt), polystyrene on silicon dioxide ($SiO_2$), and a combination thereof.

10. The method of claim 1, wherein patterning the masking layer does not require any etching.

11. The method of claim 1, wherein the MIM capacitor comprises:
a first conductive layer formed over the first dielectric layer;
a second dielectric layer formed over the first conductive layer; and
a second conductive layer formed over the second dielectric layer.

12. The method of claim 11, wherein at least one of the first conductive layer and/or the second conductive layer comprises at least one of titanium (Ti), titanium nitride (TiN), tantalum (Ta), and a combination thereof.

13. The method of claim 11, wherein the second dielectric layer comprises at least one of zirconium dioxide ($ZrO_2$), tantalum pentoxide ($Ta_2O_5$), aluminum oxide ($Al_2O_3$), titanium dioxide ($TiO_2$), hafnium oxide ($HfO_2$), lanthanum oxide ($La_2O_3$), strontium titanate ($SrTiO_3$), and a combination thereof.

14. The method of claim 1, wherein after depositing the MIM capacitor over the patterned first dielectric layer, the method further comprises:
depositing a third dielectric layer over the MIM capacitor.

15. The method of claim 14, wherein at least one of the first dielectric layer and the third dielectric layer is a passivation layer.

16. The method of claim 1, wherein the hardmask layer comprises at least one of silicon nitride ($Si_3N_4$), silicon dioxide ($SiO_2$), silicon oxynitride ($SiO_xN_y$), a silicon (Si)-rich polymer having a Si concentration greater than or equal to about 20%, titanium nitride (TiN), and a combination thereof.

17. The method of claim 1, wherein the patterned first dielectric layer has a substantially corrugated profile and the MIM capacitor is substantially conformal to said profile.

18. The method of claim 1, wherein the patterned first dielectric layer has a substantially corrugated profile including at least one recess having a topography which itself is corrugated.

19. An integrated circuit formed by the method of claim 1.

20. A mobile computing device comprising the integrated circuit of claim 19.

21. A method of forming an integrated circuit, the method comprising:
depositing a first dielectric layer;
depositing a sacrificial layer of block co-polymer material over the first dielectric layer;
treating the layer of block co-polymer material with a non-subtractive process to cause phase separation thereof;
selectively etching the phase-separated layer of block co-polymer material to remove a phase thereof, thereby forming a pattern of recesses therein;
etching to transfer the pattern of recesses into the first dielectric layer;
etching to remove the remaining layer of block co-polymer material; and
depositing a metal-insulator-metal (MIM) capacitor over the patterned first dielectric layer.

22. The method of claim 21, wherein the patterned first dielectric layer has a substantially corrugated profile and the MIM capacitor is substantially conformal to said profile.

23. The method of claim 21, wherein the block co-polymer material comprises at least one of poly(styrene-b-methyl methacrylate), poly(styrene-b-ethylene oxide), poly(styrene-b-lactide), poly(propylene oxide-b-styrene-co-4-vinyl pyridine), poly(styrene-b-4-vinyl pyridine), poly(styrene-b-dimethylsiloxane), poly(styrene-b-methacrylate), poly(methyl methacrylate-b-n-nonyl acrylate), and a combination thereof.

* * * * *